US 6,740,998 B2

United States Patent
Roy

(10) Patent No.: US 6,740,998 B2
(45) Date of Patent: May 25, 2004

(54) SINGLE MOTOR, MULTI-AXIS STAGE

(75) Inventor: Shambhu N. Roy, Boise, ID (US)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 10/277,828

(22) Filed: Oct. 23, 2002

(65) Prior Publication Data

US 2003/0102724 A1 Jun. 5, 2003

Related U.S. Application Data

(60) Provisional application No. 60/330,931, filed on Nov. 2, 2001.

(51) Int. Cl.[7] .................................................. H02K 7/06
(52) U.S. Cl. ........................... 310/80; 310/83; 74/22 A; 74/29
(58) Field of Search .............................. 310/12, 20, 37, 310/75 R, 80, 83; 74/490.07, 490.08, 490.09, 20, 21, 22 R, 22 A, 23, 24, 25, 29, 471 XY

(56) References Cited

U.S. PATENT DOCUMENTS

| | | | |
|---|---|---|---|
| 3,475,973 A | * 11/1969 | Blazek Otta et al. ........... 74/29 |
| 3,777,581 A | * 12/1973 | Sartori ........................ 74/110 |
| 4,327,596 A | 5/1982 | Simon ......................... 74/89.2 |
| 4,409,860 A | * 10/1983 | Moriyama et al. ........ 74/490.09 |
| 4,733,737 A | * 3/1988 | Falamak ..................... 180/7.1 |
| 5,053,685 A | 10/1991 | Bacchi ........................ 318/135 |
| 5,334,892 A | 8/1994 | Chitayat ...................... 310/12 |
| 5,982,053 A | 11/1999 | Chitayat ...................... 310/12 |
| 6,215,206 B1 | 4/2001 | Chitayat ...................... 310/12 |
| 6,445,960 B1 | * 9/2002 | Borta .......................... 700/28 |
| 6,634,838 B2 | * 10/2003 | Kitamura et al. ............ 409/235 |

* cited by examiner

Primary Examiner—Dang Le

(57) ABSTRACT

A movable stage system includes a motor which rotates a rotational element, a transmission system engaged with the motor and selectively engaged with a platform, a first lock which engages the transmission system such that the transmission system moves the platform according to a rotation of the rotational element, a second lock which engages the transmission system such that the transmission system moves the platform moves according to the rotation of the rotational element. When the first lock engages and the second lock does not engage the transmission system, the transmission system moves the platform in a first direction according to the rotation of the rotational element. When the first lock does not engage and the second lock engages with the transmission system, the transmission system moves the platform in a second direction other than the first direction according to the rotation of the rotational element.

20 Claims, 8 Drawing Sheets

SINGLE MOTOR, MULTI-AXIS STAGE

CROSS-REFERENCE TO RELATED APPLICATION

This application claims the benefit under 35 U.S.C. §119 of U.S. Provisional Application No. 60/330,931, filed Nov. 2, 2001, in the United States Patent and Trademark Office, the disclosure of which is incorporated herein by reference.

BACKGROUND OF THE INVENTION

In general, in order to move a platform such as those used in high precision equipment, such as a stage used in a handler or a tester for Automatic Test Equipment (ATE), multiple actuators or linear motors are required in order to achieve multiple degrees of freedom. For example, the device disclosed in U.S. Pat. No. 5,334,892, the disclosure of which is incorporated herein by reference, relies upon an a first linear motor to move in an X and a second linear motor to move in a Y direction. In addition, in U.S. Pat. Nos. 5,982,053 and 6,215,206, the disclosures of which are incorporated herein by reference, an actuator for use with a stage is able to both rotate about a theta axis and to move along a Z axis that is parallel with the theta axis. As such, using these conventional devices, in order to move in the X direction, the Y direction, and to rotate about a theta axis, three actuators would be required.

U.S. Pat. No. 4,327,596, which is incorporated herein by reference, discloses a single motor that engages a pulley system that selectively moves a platform in an X and Y direction. However, this system lacks a rotational ability. Further, the solution proposed in U.S. Pat. No. 4,327,596 has a complex construction and would take up an unacceptable amount of space for use in certain high precision equipment, such as Automatic Testing Equipment. Lastly, this solution does not have a positive drive, which would allow for errors and slippage and/or the string tension which is not be acceptable in high precision equipment.

SUMMARY OF THE INVENTION

It is an object of the invention to provide a single motor, multi axis stage positioning system having the ability to move in X and Y directions.

It is an additional object of the invention to provide a single motor, multi axis stage positioning system having the ability to move in X and Y directions as well as rotating about a theta axis.

Additional objects and advantages of the invention will be set forth in part in the description which follows and, in part, will be obvious from the description, or may be learned by practice of the invention.

To achieve the above and other objects of the invention, an embodiment of an actuator system for moving a platform includes a motor which rotates a rotational element, a transmission system which engages the motor and selectively engages the platform, a first lock which engages the transmission system such that the transmission system moves the platform according to a rotation of the rotational element, and a second lock which engages the transmission system such that the transmission system moves the platform moves according to the rotation of the rotational element, where, when the first lock engages the transmission system and the second lock does not engage the transmission system, the transmission system moves the platform in a first direction according to the rotation of the rotational element, and when the first lock does not engage the transmission system and the second lock engages the transmission system, the transmission system moves the platform in a second direction other than the first direction according to the rotation of the rotational element.

According to an aspect of the invention, the actuator further includes a rotation lock that selectively engages the transmission system such that, when the rotation lock is locked, the platform rotates about a third direction according to the rotation of the rotational element.

According to another aspect of the invention, the transmission system further comprises first and second rails and first and second connectors, the first rail is connected to the rotational element so as to move in the first direction according to the rotation of the rotational element, the second rail is connected to the rotational element so as to move in the second direction according to the rotation of the rotational element, when the first lock engages the transmission system, the first lock connects the first connector with the first rail and the platform and the platform moves with the first rail according to the rotation of the rotational element, and when the second lock engages the transmission system, the second lock connects the second connector with the second rail and the platform and the platform moves with the first rail according to the rotation of the rotational element.

According to a further aspect of the invention, the actuator further includes a first guide unit which is slideably connected to the first rail so as to guide the movement of the first rail in the first direction and to prevent a movement of the first rail in the second direction, and a second guide unit which is slideably connected to the second rail so as to guide the movement of the second rail in the second direction and to prevent a movement of the second rail in the first direction.

According to another embodiment of the invention, a movable stage system includes a platform, a motor which rotates a rotational element, a transmission system engaged with the motor and selectively engaged with the platform, a first lock which engages the transmission system such that the transmission system moves the platform according to a rotation of the rotational element, a second lock which engages the transmission system such that the transmission system moves the platform moves according to the rotation of the rotational element, and a controller which controls the motor and first and second locks such that, when the first lock engages the transmission system and the second lock does not engage the transmission system, the transmission system moves the platform in a first direction according to the rotation of the rotational element, and when the first lock does not engage the transmission system and the second lock engages the transmission system, the transmission system moves the platform in a second direction other than the first direction according to the rotation of the rotational element.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE EMBODIMENTS

Figure 1:
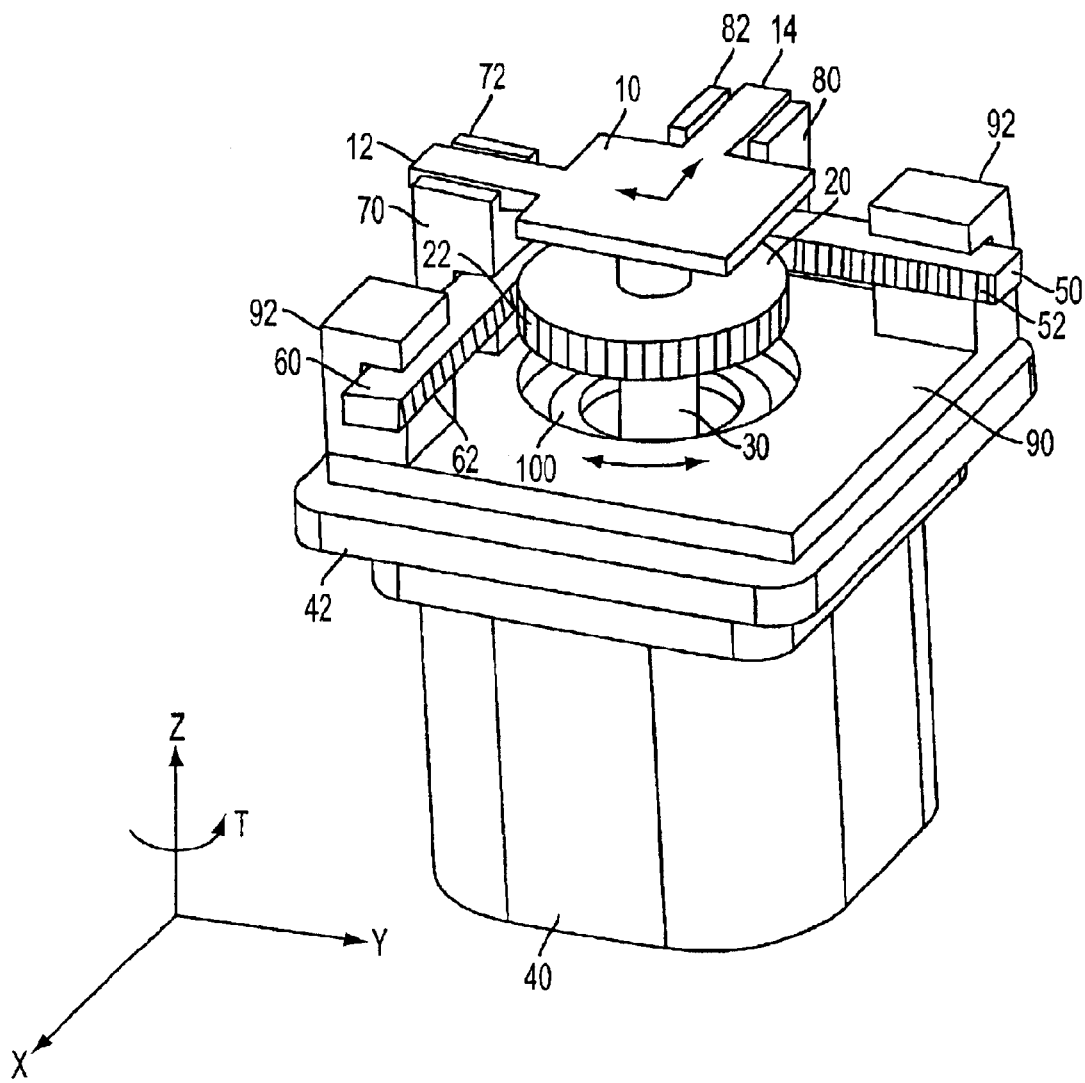
FIG. 1 is an isometric view of the positioning system according to an embodiment of the invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
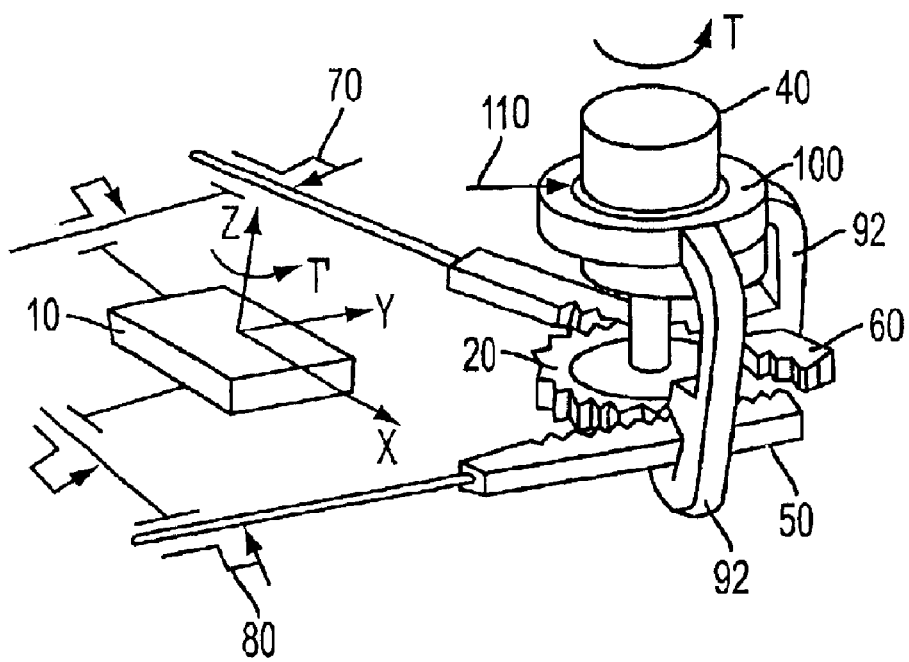
FIG. 2 is a schematic isometric view of the positioning system according to another embodiment of the invention.

As shown in FIGS. 1 and 2, the positioning system according to an embodiment of the invention includes a platform 10, such as would be used in a stage for Automatic Test Equipment. The platform (i.e., end effectuator) 10 is disposed above a pinion 20, but is not engaged with the pinion 20. The pinion 20 is connected through a transmission rod 30 to a motor 40. The motor 40, as shown in FIG. 1, is a Panasonic Minas S series digital AC servo motors and drivers lowest inertia motor, such as the MUMS 3AZ 30 W. However, it is understood that other motors or actuators would be useful for the motor 40.

Attached to the motor 40 is a base plate 42. Rotatably connected to the base plate 42 using a bearing 100 is a rotational plate 90. Attached to the rotational plate 90 are supports 92, which slideably support an X rack 60 and a Y rack 50 while allowing movement of the racks 60 and 50 in the X and Y directions. The X rack 60 and the Y rack 50 are in a rack and pinion arrangement with pinion 20 using pinion teeth 22, which engage rack teeth 52 and 62. As shown, when the motor 40 rotates the pinion 20 via the transmission rod 30, the pinion 20 moves the racks 60 and 50 along the corresponding X and Y directions. Examples of the racks 60, 50 and the pinion 20 include those provided by the KG Gear.

In order to move the platform 10, the platform 10 has a Y extended portion 12 and an X extended portion 14. Further, an X lock 70 is selectively engaged with the X rack 60, but is slidably engaged to the Y extended portion 12 through X lock guide 72. The Y extended portion 12 is able to move in the Y direction relative to the X lock guide 72, which is a prismatic joint, but is restrained from moving relative to the X lock guide 72 in the X direction. As such, when the X lock 70 is engaged with the X rack 60 and the Y lock 80 is disengaged with the Y rack 50, the X lock 70 will move with the X rack 60 according to the rotation of the pinion 20. Since the Y extended portion 12 only moves in the Y direction, the X lock guide 72 moves the platform 10 in the X direction along with the X rack 60.

In order to prevent a drift of the platform 10 in the Y direction according to an aspect of the invention, the X lock guide 72 further includes a restraint to prevent the Y extended portion 12 from drifting in the Y direction relative to the X lock guide 72 as the platform 10 is actuated in the X direction.

Similarly, a Y lock 80 is located on the Y rack 50 to be selectively engaged with the Y rack 50. The X extended portion 14 is slidably received into the Y lock guide 82, which is a prismatic joint, such that the X extended portion 14 can move in the X direction, but is restrained from moving in the Y direction. As such, when the Y lock 80 is engaged (i.e., attached) to the Y rack 50 and the X lock 70 is disengaged from the X rack 60, the platform 10 moves in the Y direction since the Y lock 80 is attached to the Y rack 50, which is being moved by the pinion 20.

In order to prevent a drift of the platform 10 in the X direction according to an aspect of the invention, the Y lock guide 82 further includes a restraint to prevent the X extended portion 14 from drifting in the X direction relative to the Y lock guide 82 as the platform 10 is actuated in the Y direction.

In order to rotate about the theta axis, a T lock 110 engages the pinion 20 such that the rotational plate 90 rotates the end platform 10 about the theta (Z) axis.

The locks 70, 80, 110 can be any type of lock or circular electromagnets such as those sold by Magnetic Systems International or Duramag.

Further, the movement of the X rack 60 and the Y rack 50 is not independent according to an embodiment of the invention. In addition, the X and Y racks 60 and 50 are arranged such that, when the X and Y locks 70 and 80 are both engaged, the platform 10 moves along a curve. However, it is understood that the racks 60 and 50 can be selectively engaged, and that it might necessary to disengage/decouple the racks 60 and 50 from the pinion 20 for purposes of resetting the rack positions.

Figure 3:
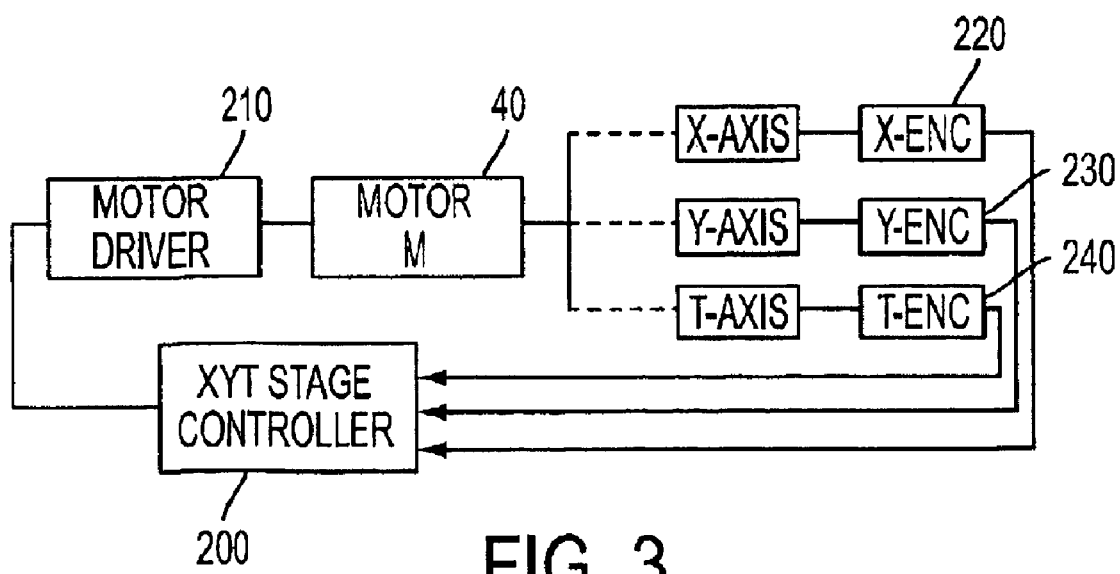
FIG. 3 is a schematic representation of a control system for use with the positioning system according to a further embodiment of the invention.

A control system is shown in FIG. 3 according to an embodiment of the invention, and includes a stage controller 200 that controls a motor driver 210 to control the motor 40. In order for the controller 200 to determine the X, Y, and theta positions, X, Y, and theta encoders 220, 230, 240 provide information to the controller 200 forming a feedback loop. Using the control system, the controller 200 selectively engages the locks 70, 80, 110 individually to move the platform 10.

For instance, in order to move the platform 10 to a new position that is 10 millimeters in the X direction, 5 millimeters in the Y direction, and is rotated about the theta axis 15°, the controller 200 performs three basic operations. Starting with all locks 70, 80 and 110 on (i.e., engaged), the Y lock 80 is released and the motor 40 leaving the X lock 70 engaged. The motor 40 drives the X rack 60 through the pinion 20 until the X encoder 220 detects 10 millimeters of motion in the X direction. The controller 200 then releases the X lock 70 and engages the Y lock 80. The motor 40 rotates the pinion 20 until the Y encoder 230 detects 5 millimeters of motion in the Y direction. Next, the X lock 70 is engaged along with the Y lock 80, and the theta (T) lock 110 is released. The motor 40 rotates the pinion 20 until the theta encoder 240 detects 15° of rotational motion. At this point, the theta lock 110 is engaged and the platform 10 has been moved to the desired position.

If the X and Y lock guides 72, 82 further include restraints, the X lock guide 72 is released when the X lock 70 is released so as to allow the platform 10 is to be moved in the Y direction. Conversely, the Y lock guide 82 is released when the Y lock 80 is released so as to allow the platform 10 is to be moved in the X direction.

Of course, it is understood that any permutation of these operations can be performed without changing the final result. Further, it is understood that other types of locks, such as electrical solenoids, pneumatic or hydraulic mechanisms can be used for any of the X Y and theta locks 70, 80 and 110. Further, it is understood that the controller 200 could be a programmable computer with the control sequences controlled by a computer program encoded on a computer readable medium. Further, the encoders 220, 230, 240 can also be optical encoders or other mechanisms suitable for detecting relative motion as commonly understood and used in control systems.

Figure 4:
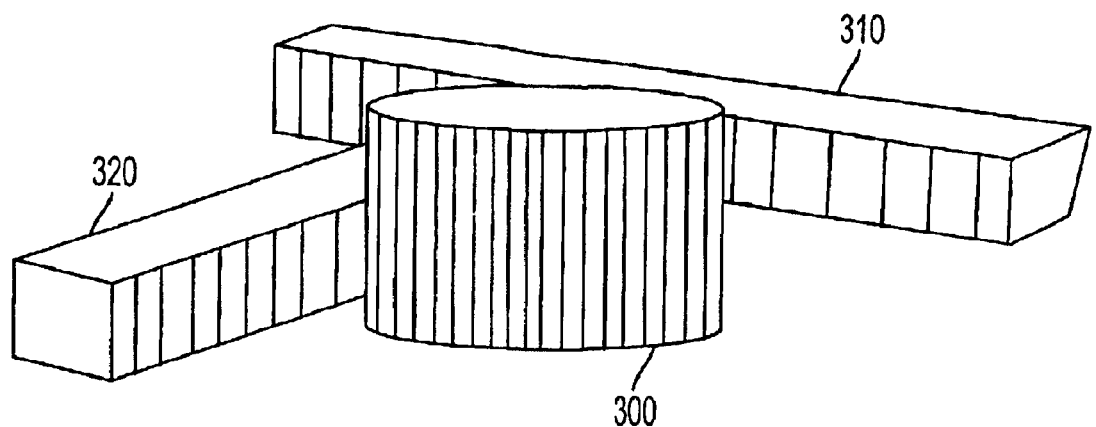
FIG. 4 is a partial view of a rack-and-pinion arrangement for use in a yet further embodiment of the invention for large X and Y displacements.

While the embodiment shown in FIG. 1 is useful for small displacements, it is understood that large displacements can be achieved using other rack-and-pinion arrangements such as that shown in FIG. 4. According to the embodiment of the invention shown in FIG. 4, the pinion 300 is elongated so as to engage overlapping X rack 310 and Y rack 320. It is understood that extended portions 12 and 14 would be adapted to allow for the sufficient motion in the X and Y directions. It is understood that a similar result is achieved if one of the racks 310 and 320 is split such that the other of the racks 310 and 320 passes through the split.

Figure 5:
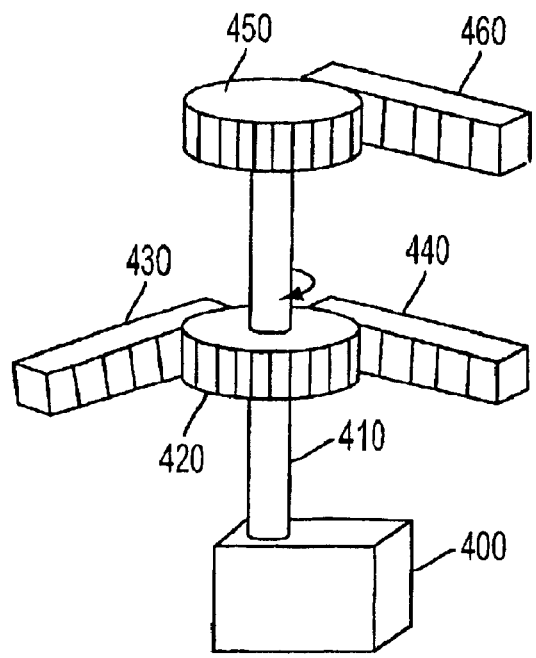
FIG. 5 is a multi-level rack-and-pinion arrangement according to a still further embodiment of the invention.

In addition, as shown in the embodiment of the invention in FIG. 5, multiple levels and multiple platforms could be controlled using a single motor 400 and a single transmission rod 410. As shown, a first level pinion 420 is engaged to X and Y racks 430 and 440. Further, a second level pinion 450 is engaged to a second level rack 460, where the pinions 450 and 420 are connected to the motor 400 through the common transmission rod 410. It is understood that racks 430, 440, 460 have corresponding locks (not shown) that are selectively engaged with the racks 430, 440, 460 to move corresponding platforms (not shown).

As such, multiple platforms can be controlled using multiple locks using a single motor or fewer motors than platforms. Thus, using a proper combination, 0.125 motors per degree of freedom can be achieved such that eight locks are used with one motor for controlling 4 XY stages, 16 locks and two motors for 8 XY stages and so on. In this way, in such applications as a logic handler, which tests only a few devices under test (DUTS), the X Y theta positioning system will eliminate the need for precision handling of each socket using multiple motors. Further, for a memory handler placing a large number of devices, multiple stages can be used with each of the stages being used for at least one site.

It is understood according to the present invention that the transmission rods can be flexible instead of rigid, that the rack and pinion teeth can be altered to have different spacing so as to produce different ranges of motion for a common rotation of the motor. Further, the locks can be any type of mechanism that use friction to selectively hold a rack to a platform. Also, while the above invention is disclosed in terms of allowing infinite rotation, it is also possible to envision a transmission system that allows a tilting of the platform out of the X Y plane using known locking and tilting mechanisms.

In addition, it is understood that, instead of a rack and pinion arrangement, helical gear pairs with perpendicular axes of rotation combined with a nut and spindle mechanism can be used, where the helical gear is rigidly attached to a vertical (theta) motor axis to drive two helical pinions in the X and Y directions along the horizontal axis. Each of the helical pinions has an internal nut to hold the two spindles driving the platform in the X and Y directions.

Figure 6:
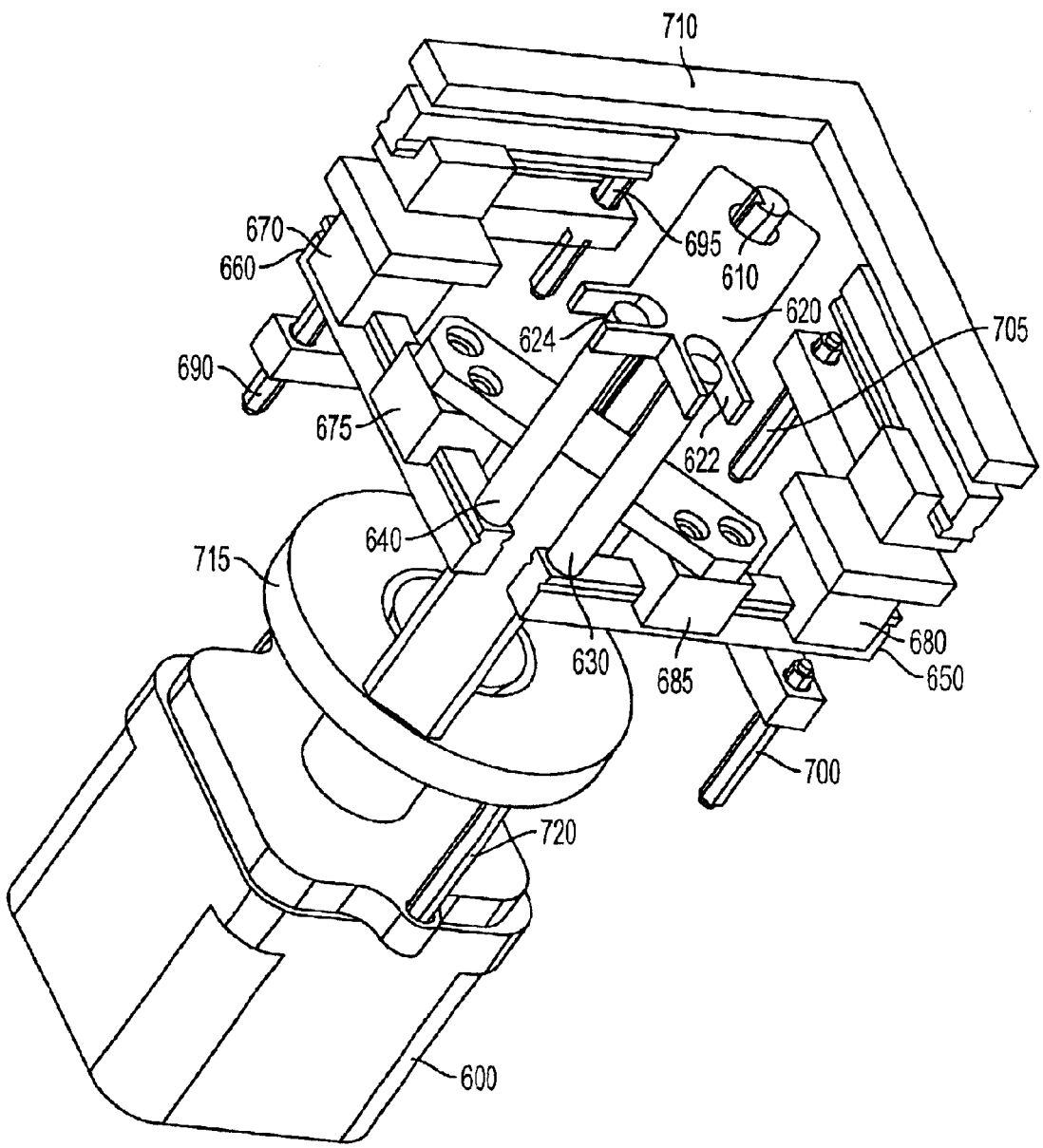
FIG. 6 is an isometric view of the positioning system according to another embodiment of the invention.
Figure 7:
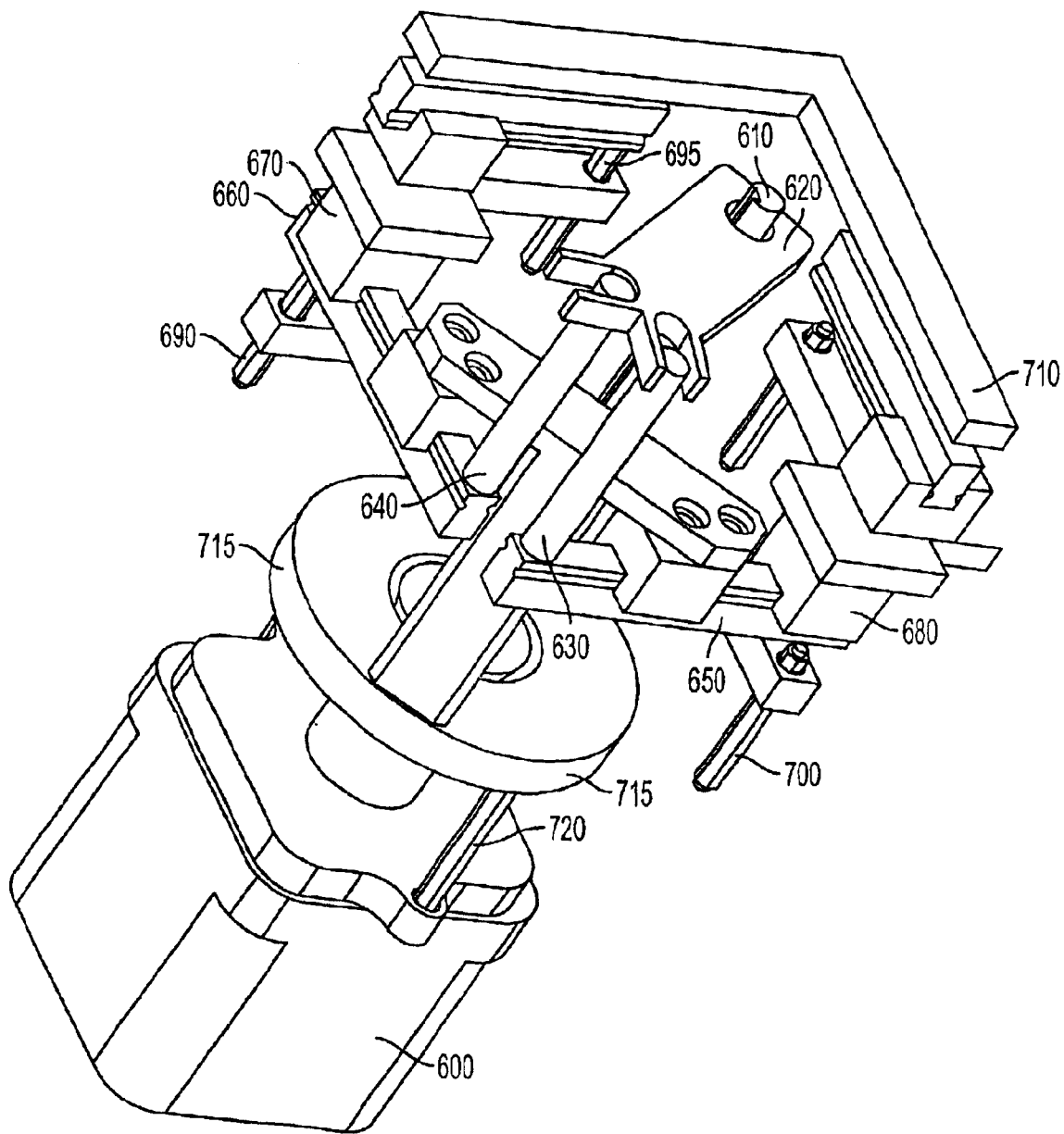
FIG. 7 is an isometric view of the positioning system of FIG. 6 in which the platform has been moved due to the movement of a rail.
Figure 8:
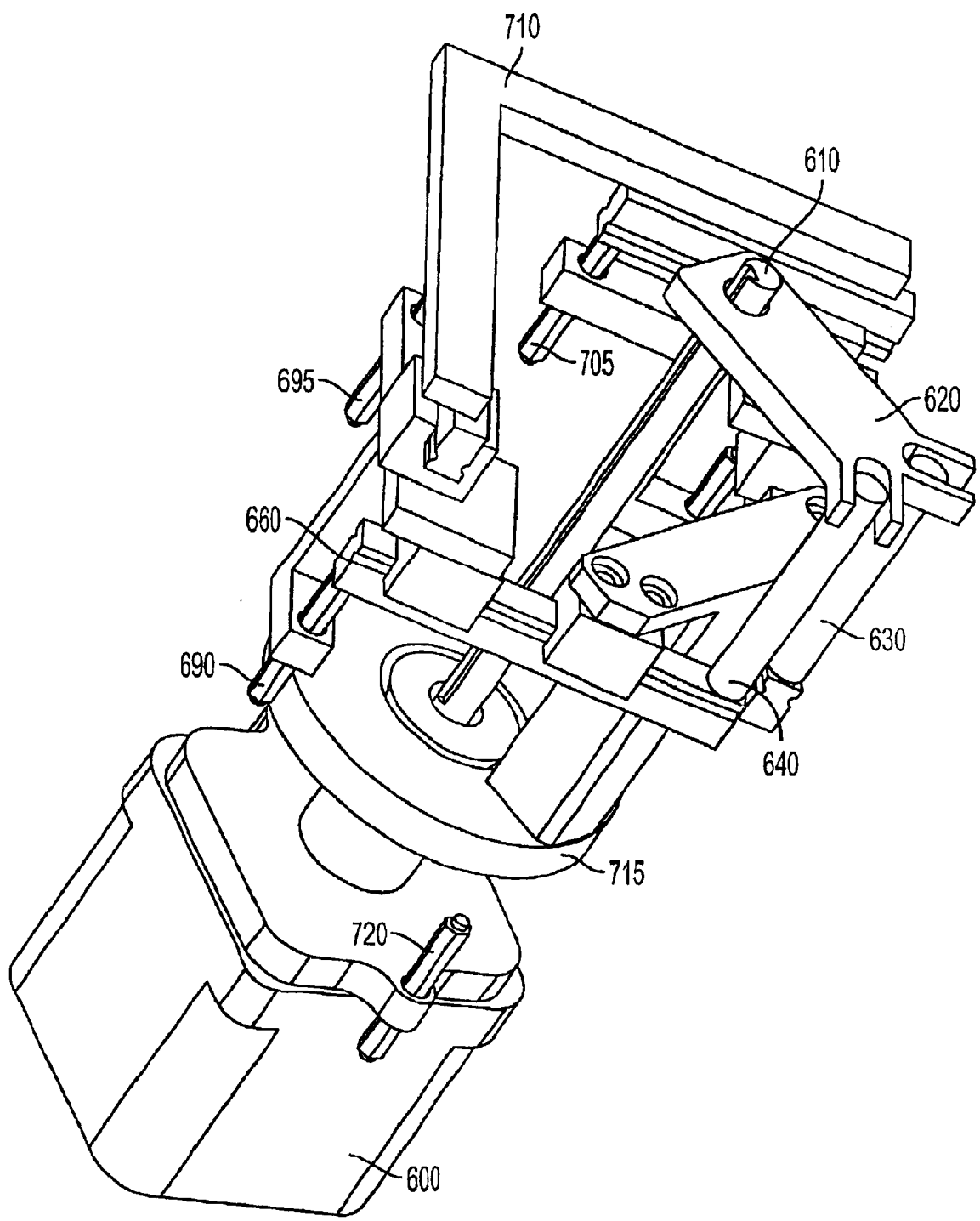
FIG. 8 is an isometric view of the positioning system of FIG. 6 in which the platform has been rotated due to the movements of the rails.

FIGS. 6 through 8 show a positioning system according to a further embodiment of the present invention. As shown in FIG. 6, the positioning system includes a motor 600 which rotates a shaft 610. The shaft 610 is attached to a crank arm 620 such that the crank arm 620 rotates with the shaft 610. The crank arm 620 includes slots 622, 624. Pins 630, 640 are slideably receiving in the corresponding slots 622, 624. The pins 630, 640 extend from corresponding rails 650, 660. As such, when the crank arm 620 is rotated, the rotational motion of the crank arm 620 is transferred into translational motions for the rails 650, 660 as shown in FIGS. 6 and 7.

The rails 650, 660 are slideably engaged in guides 670, 680 in order to guide the translational motion of the rails 650, 660. The rails 650, 660 are also slideably engaged in support guides 675, 685. In order to transfer the motion of the rails 650, 660 into movement of a platform 710, a system of locks 690, 695, 700, 705, 720 is used. Further, the platform 710 and the support guides 675, 685 are supported on a rotational unit 715. The rotational unit 715 is rotatably supported above the motor 600 so as to be rotatable relative to the motor 600 and motor shaft 610.

Specifically, as shown FIGS. 6 and 7, in order to move in a first direction, the locks 690, 695, 720 are engaged, and the locks 700, 705 are disengaged such that the motion of the rail 660 is transferred to the platform 710 through the locks 690, 695 so as to move the platform 710 in a first direction. The rotational lock 720 is engaged with the rotational unit 715 in order to prevent the rotational unit 715 from rotating the platform 710.

Conversely, in order to move in the second direction, the locks 690, 695 are disengaged, and the locks 700, 705 and 720 are engaged. As such, the motion of the rail 650 is transferred to the platform 710 through the locks 700, 705 so as to move the platform 710 in a second direction.

In order to rotate the platform 710, locks 690, 695, 700, 705 are engaged, but the rotational lock 720 is disengaged. As shown in FIG. 8, the movement of the rails 650, 660 is transferred to the platform 710 through the locks 690, 695, 700, 705. Since the rotational lock 720 is disengaged, the platform 710 and the rotational unit 715 is allowed to rotate relative to the motor 600.

Figure 9:
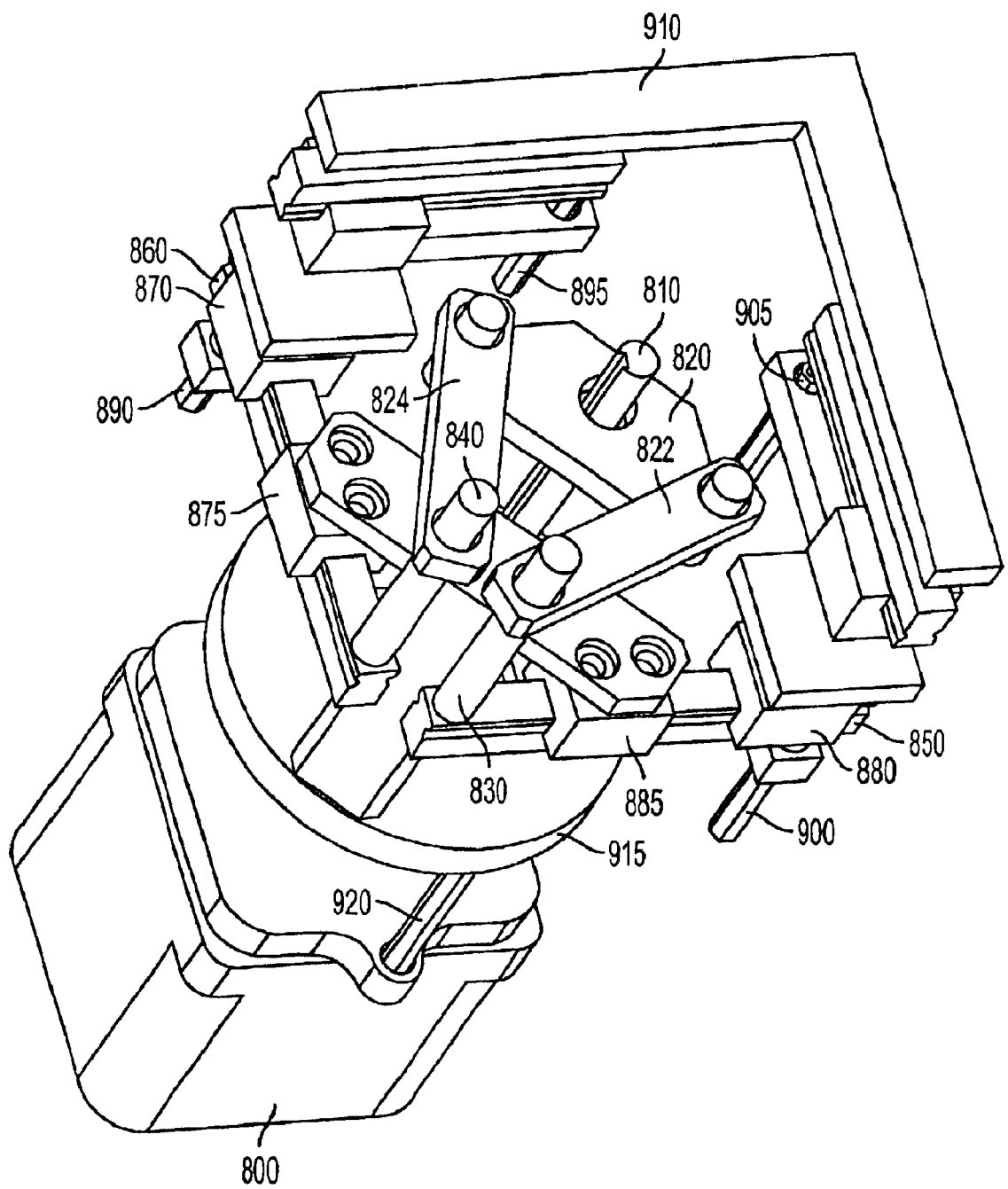
FIG. 9 is an isometric view of the positioning system according to a further embodiment of the invention.
Figure 10:
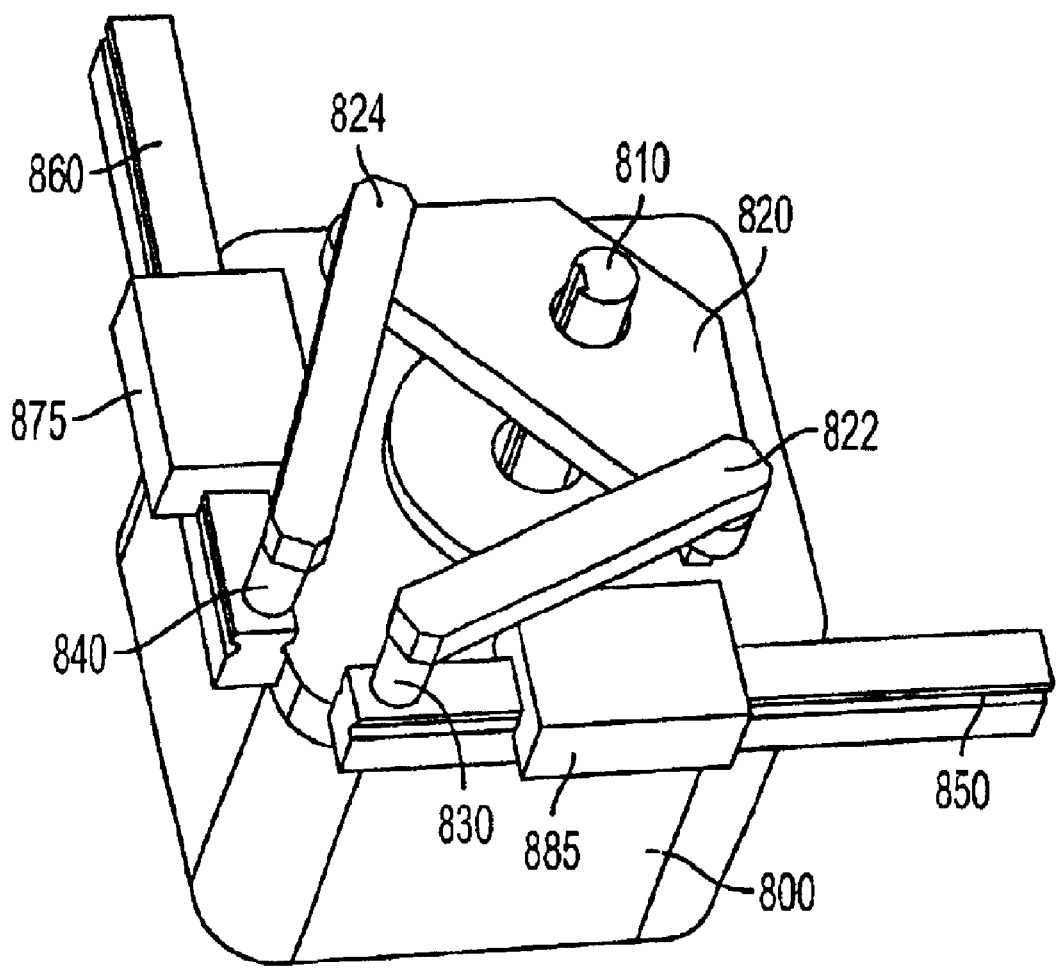
FIG. 10 is an isometric view of the transmission system shown in FIG. 9.

FIGS. 9 and 10 show positioning system according to an additional embodiment of the present invention. As shown in FIG. 9, the positioning system includes a motor 800 which rotates a shaft 810. The shaft 810 is attached to a crank arm 820 such that the crank arm 820 rotates with the shaft 810. The crank arm 820 is rotatably attached to links 822, 824. Pins 830, 840 are slideably receiving in the corresponding links 822, 824. The pins 830, 840 extend from corresponding rails 850, 860. As such, when the crank arm 820 is rotated, the rotational motion of the crank arm 820 is transferred into translational motions for the rails 850, 860 as shown more clearly in FIG. 10.

The rails 850, 860 are slideably engaged in guides 870, 880 in order to guide the translational motion of the rails 850, 860. The rails 850, 860 are also slideably engaged in support guides 875, 885. In order to transfer the motion of the rails 850, 860 into movement of a platform 910, a system of locks 890, 895, 900, 905, 920 is used. Further, the platform 910 and the support guides 875, 885 are supported on a rotational unit 915. The rotational unit 915 is rotatably supported above the motor 800 so as to be rotatable relative to the motor 800 and motor shaft 810.

As in the embodiment shown FIGS. 6 and 7, in order to move in a first direction, the locks 890, 895, 920 are engaged, and the locks 900, 905 are disengaged such that the motion of the rail 860 is transferred to the platform 910 through the locks 890, 895 so as to move the platform 910 in a first direction. The rotational lock 920 is engaged with the rotational unit 915 in order to prevent the rotational unit 915 from rotating the platform 910.

Conversely, in order to move in the second direction, the locks 890, 895 are disengaged, and the locks 900, 905 and 920 are engaged. As such, the motion of the rail 850 is transferred to the platform 910 through the locks 900, 905 so as to move the platform 910 in a second direction.

In order to rotate the platform 910, locks 890, 895, 900, 905 are engaged, but the rotational lock 920 is disengaged. As in the embodiment shown in FIG. 8, the movement of the rails 850, 860 is transferred to the platform 910 through the locks 890, 895, 900, 905. Since the rotational lock 920 is disengaged, the platform 910 and the rotational unit 915 is allowed to rotate relative to the motor 800.

According to the present invention, a single motor is able to control a platform having multiple degrees of freedom, including both translational and rotational motions through the use of a mechanism to selectively engage a platform to be moved in a desired direction. For instance, the platform is engaged with a rack to move in the desired direction. As such, the present invention provides a low cost, compact mechanism that is easier to maintain and simultaneously allows for high precision control of platforms and stages and has the ability to achieve infinite rotation about an axis.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An actuator system for moving a platform, comprising:
   a motor which rotates a rotational element;
   a transmission system which engages the motor and selectively engages the platform, the transmission system comprising a first rail connected to the rotational element so as to move in a first direction according to the rotation of the rotational element, and a second rail connected to the rotational element so as to move in a second direction according to the rotation of the rotational element;
   a first lock which engages the transmission system such that the transmission system moves the platform according to a rotation of the rotational element; and
   a second lock which engages the transmission system such that the transmission system moves the platform moves according to the rotation of the rotational element,
   wherein:
      when the first lock engages the transmission system and the second lock does not engage the transmission system, the first lock connects the first rail and the platform such that the platform moves with the first rail in the first direction according to the rotation of the rotational element, and
      when the first lock does not engage the transmission system and the second lock engages the transmission system, the second lock connects the second rail and the platform such that the platform moves with the second rail in the second direction according to the rotation of the rotational element.

2. The actuator of claim 1, wherein the transmission system further comprises a rail connection unit which translates the rotation of the shaft into the movements of the first and second rails.

3. The actuator of claim 2, wherein:
   the rail connection unit comprises a first interlocking unit, and
   each of the first and second rails comprises a second interlocking unit which interlocks with the first interlocking unit such that, as the rail connection unit rotates according to the rotation of the shaft, the first and second rails are moved in the corresponding first and second directions.

4. The actuator of claim 3, wherein, as the rail connection unit rotates according to the rotation of the rotational element, an edge of the first interlocking unit presses against corresponding edges of the second interlocking units so as to push the first and second rails in the corresponding first and second directions.

5. The actuator of claim 4, further comprising:
   a first guide unit which is slideably connected to the first rail so as to guide the movement of the first rail in the first direction and to prevent a movement of the first rail in the second direction, and
   a second guide unit which is slideably connected to the second rail so as to guide the movement of the second rail in the second direction and to prevent a movement of the second rail in the first direction.

6. An actuator system for moving a platform, comprising:
   a motor which rotates a rotational element;
   a transmission system which engages the motor and selectively engages the platform;
   a first lock which engages the transmission system such that the transmission system moves the platform according to a rotation of the rotational element;
   a second lock which engages the transmission system such that the transmission system moves the platform moves according to the rotation of the rotational element; and
   a rotation lock that selectively engages the transmission system,
   wherein:
      when the first lock engages the transmission system and the second lock does not engage the transmission system, the transmission system moves the platform in a first direction according to the rotation of the rotational element,
      when the first lock does not engage the transmission system and the second lock engages the transmission system, the transmission system moves the platform in a second direction other than the first direction according to the rotation of the rotational element, and
      when the rotation lock is not engaged to the transmission system, the platform rotates about a third direction according to the rotation of the rotational element.

7. The actuator of claim 6, wherein:
   the transmission system further comprises a rotational plate which is connected to the platform and to which the rotation lock locks,
   when the rotation lock is locked, the platform does not rotate according to the rotation of the rotational element, and
   when the rotation lock is not locked, the platform rotates about the third direction according to the rotation of the rotational element.

8. The actuator of claim 7, wherein:
the transmission system further comprises:
a first rail connected to the rotational element so as to move in the first direction according to the rotation of the rotational element, and
a second rail connected to the rotational element so as to move in a second direction according to the rotation of the rotational element,
when the first lock engages the transmission system and the second lock does not engage the transmission system, the first lock connects the first connector with the first rail and the platform and the platform moves with the first rail in the first direction according to the rotation of the rotational element, and
when the first lock does not engage the transmission system and the second lock engages the transmission system, the second lock connects the second connector with the second rail and the platform and the platform moves with the second rail in the second direction according to the rotation of the rotational element.

9. The actuator of claim 8, wherein:
the transmission system comprises a shaft which rotates according to the rotation of the rotational element, and
a rail connection unit connected to the shaft and which translates the rotation of the shaft into the movements of the first and second rails, and
the rotational plate comprises a hole through which the shaft passes between the rotational element and the rail connection unit such that the shaft is rotatable relative to the rotational plate.

10. The actuator of claim 9, wherein:
the rotational plate is rotatably attached to the motor,
the rotation lock comprises a connecting member,
when the rotation lock is to be locked, the connecting member connects the motor and the rotational plate so as to prevent the rotation of the rotational plate relative to the motor, and
when the rotation lock is to be unlocked, the connecting member does not connect the motor and the rotational plate so as to allow the rotation of the rotational plate.

11. The actuator of claim 10, wherein the transmission system further comprises:
a first guide unit which is slideably connected to the first rail so as to guide the movement of the first rail in the first direction and to prevent a movement of the first rail in the second direction, and
a second guide unit which is slideably connected to the second rail so as to guide the movement of the second rail in the second direction and to prevent a movement of the second rail in the first direction.

12. The actuator of claim 11, wherein the first and second guide units are rigidly connected to the rotational plate-such that, when the rotation lock is not locked and the first and second locks are locked, the platform rotates according to the rotation of the rotational element.

13. The actuator of claim 12, wherein
the first guide unit comprises first primary and auxiliary guides which are slideably connected to the first rail so as to guide the movement of the first rail in the first direction and to prevent the movement of the first rail in the second direction, and
the second guide unit comprises second primary and auxiliary guides which are slideably connected to the second rail so as to guide the movement of the second rail in the second direction and to prevent the movement of the second rail in the first direction.

14. The actuator of claim 13, wherein the first and second auxiliary guide units are rigidly connected to the rotational plate such that, when the rotation lock is not locked and the first and second locks are locked, the platform rotates according to the rotation of the rotational element.

15. A movable stage system, comprising:
a platform;
a motor which rotates a rotational element;
a transmission system engaged with the motor and selectively engaged with the platform;
a first lock which engages the transmission system such that the transmission system moves the platform according to a rotation of the rotational element;
a second lock which engages the transmission system such that the transmission system moves the platform moves according to the rotation of the rotational element;
a rotation lock that selectively engages the transmission system; and
a controller which controls the motor, the first and second locks, and the rotation lock such that,
when the controller controls the first lock to engage the transmission system and the second lock to not engage the transmission system, the transmission system moves the platform in a first direction according to the rotation of the rotational element,
when the controller controls the first lock to not engage the transmission system and the second lock to engage the transmission system, the transmission system moves the platform in a second direction other than the first direction according to the rotation of the rotational element, and
when the controller controls the rotation lock to not engage the transmission system, the platform rotates about a third direction according to the rotation of the rotational element.

16. The movable stage system of claim 15, wherein:
the transmission system further comprises
a first rail connected to the rotational element so as to move in the first direction according to the rotation of the rotational element, and
a second rail connected to the rotational element so as to move in the second direction according to the rotation of the rotational element,
when the controller controls the first lock to engage the transmission system, the first lock connects the first rail and the platform and the platform moves with the first rail according to the rotation of the rotational element, and
when the controller controls the second lock to engage the transmission system, the second lock connects the second rail and the platform and the platform moves with the first rail according to the rotation of the rotational element.

17. The movable stage system of claim 16, wherein the transmission system further comprises a shaft which rotates according to the rotation of the rotational element, and a rail connection unit connected to the shaft and which translates the rotation of the shaft into the movements of the first and second rails.

18. The movable stage system of claim 16, wherein:
the transmission system further comprises a rotational plate which is connected to the platform and to which the rotation lock locks,
when the controller controls the rotation lock to be locked, the platform does not rotate according to the rotation of the rotational element, and when the controller controls the rotation lock to not be locked, the platform rotates about a third direction according to the rotation of the rotational element.

19. The movable stage system of claim 16, wherein:

the transmission system comprises a rail connection unit which translates the rotation of the rotational element into the movements of the first and second rails, the rail connection unit comprises a first interlocking unit, and each of the first and second rails comprise a second interlocking unit which interlocks with the first interlocking unit such that, as the rail connection unit rotates according to the rotation of the rotational element, an edge of the first interlocking unit presses against corresponding edges of the second interlocking units so as to push the first and second rails in the corresponding first and second directions.

20. An actuator system for moving a platform, comprising:

a motor which rotates a rotational element;

rails to support the platform;

a transmission system which engages the motor and selectively engages the platform using the rails, the transmission system comprising first through fourth guides to support the rails;

a first lock which is actuated to connect the first guide and a first one of the rails such that the transmission system moves the platform according to a rotation of the rotational element; and a second lock which is actuated to connect the second guide and a second one of the rails such that the transmission system moves the platform moves according to the rotation of the rotational element, wherein:

when the first lock is actuated and the second lock is not actuated, the first rail moves with the first guide, and the second guide and one of the third and fourth guides allows the platform to move with the first guide according to the rotation of the rotational element, and when the second lock is actuated and the first lock is not actuated, the second rail moves with the second guide, and the first guide and one of the third and fourth guides allows the platform to move with the second guide according to the rotation of the rotational element.

* * * * *

UNITED STATES PATENT AND TRADEMARK OFFICE
CERTIFICATE OF CORRECTION

PATENT NO. : 6,740,998 B2  
DATED : May 25, 2004  
INVENTOR(S) : Shambhu N. Roy

It is certified that error appears in the above-identified patent and that said Letters Patent is hereby corrected as shown below:

Column 9,
Line 53, after "plate" delete "-".

Column 10,
Line 16, delete "moves".

Column 12,
Line 8, after "platform" delete "moves" (second occurrence).

Signed and Sealed this

Fifteenth Day of March, 2005

JON W. DUDAS  
*Director of the United States Patent and Trademark Office*